United States Patent
Tauzin

(10) Patent No.: US 7,439,092 B2
(45) Date of Patent: Oct. 21, 2008

(54) THIN FILM SPLITTING METHOD

(75) Inventor: Aurélie Tauzin, Saint Martin le Vinoux (FR)

(73) Assignee: Commissariat A l'Energie Atomique, Paris (FR)

( * ) Notice: Subject to any disclaimer, the term of this patent is extended or adjusted under 35 U.S.C. 154(b) by 58 days.

(21) Appl. No.: 11/437,901

(22) Filed: May 19, 2006

(65) Prior Publication Data

US 2007/0004176 A1 Jan. 4, 2007

(30) Foreign Application Priority Data

May 20, 2005 (FR) .................................. 05 05091

(51) Int. Cl.
*H01L 21/00* (2006.01)
(52) U.S. Cl. ..................... 438/46; 438/162; 438/373; 438/422; 438/456; 438/480; 257/E21.319
(58) Field of Classification Search ................. 438/460, 438/162, 373, 422, 456, 480; 257/E21.319
See application file for complete search history.

(56) References Cited

U.S. PATENT DOCUMENTS

| | | | |
|---|---|---|---|
| 4,028,149 A | 6/1977 | Deines et al. | |
| 4,254,590 A | 3/1981 | Eisele et al. | |
| 4,637,869 A * | 1/1987 | Glocker et al. | 204/192.11 |
| 5,242,863 A | 9/1993 | Xiang-Zheng et al. | |
| H1287 H * | 2/1994 | Zeisse et al. | 257/410 |
| 5,300,788 A | 4/1994 | Fan et al. | |
| 5,374,564 A * | 12/1994 | Bruel | 438/455 |
| 5,400,458 A | 3/1995 | Rambosek | |
| 5,405,802 A | 4/1995 | Yamagata et al. | |
| 5,559,043 A | 9/1996 | Bruel | |
| 5,811,348 A | 9/1998 | Matushita et al. | |
| 5,854,123 A | 12/1998 | Sato et al. | |
| 5,877,070 A | 3/1999 | Goesele et al. | |
| 5,909,627 A | 6/1999 | Egloff | |
| 5,920,764 A | 7/1999 | Hanson et al. | |
| 5,953,622 A | 9/1999 | Lee et al. | |
| 5,966,620 A | 10/1999 | Sakaguchi et al. | |
| 5,993,677 A | 11/1999 | Biasse et al. | |
| 5,994,207 A | 11/1999 | Henley et al. | |
| 6,013,563 A | 1/2000 | Henley et al. | |
| 6,020,252 A | 2/2000 | Aspar et al. | |
| 6,048,411 A | 4/2000 | Henley et al. | |
| 6,054,370 A | 4/2000 | Doyle | |
| 6,071,795 A | 6/2000 | Cheung et al. | |
| 6,103,597 A | 8/2000 | Aspar et al. | |
| 6,103,599 A | 8/2000 | Henley et al. | |
| 6,127,199 A | 10/2000 | Inoue et al. | |
| 6,146,979 A | 11/2000 | Henley et al. | |
| 6,150,239 A | 11/2000 | Goesele et al. | |
| 6,190,998 B1 | 2/2001 | Bruel et al. | |
| 6,204,151 B1 | 3/2001 | Malik et al. | |
| 6,225,190 B1 | 5/2001 | Bruel et al. | |
| 6,225,192 B1 | 5/2001 | Aspar et al. | |
| 6,271,101 B1 | 8/2001 | Fukunaga | |
| 6,303,468 B1 | 10/2001 | Aspar et al. | |
| 6,323,108 B1 | 11/2001 | Kub et al. | |
| 6,323,109 B1 | 11/2001 | Okonogi | |
| 6,346,458 B1 | 2/2002 | Bower | |
| 6,362,077 B1 | 3/2002 | Aspar et al. | |
| 6,429,104 B1 * | 8/2002 | Auberton-Herve | 438/527 |
| 6,513,564 B2 | 2/2003 | Bryan et al. | |
| 6,534,380 B1 | 3/2003 | Yamauchi et al. | |
| 6,593,212 B1 | 7/2003 | Kub et al. | |
| 6,607,969 B1 | 8/2003 | Kub et al. | |
| 6,727,549 B1 | 4/2004 | Doyle | |
| 6,756,286 B1 | 6/2004 | Moriceau et al. | |
| 6,770,507 B2 | 8/2004 | Abe et al. | |
| 6,946,365 B2 | 9/2005 | Aspar et al. | |
| 7,166,524 B2 * | 1/2007 | Al-Bayati et al. | 438/530 |
| 2002/0025604 A1 | 2/2002 | Tiwari | |

(Continued)

FOREIGN PATENT DOCUMENTS

EP 0 410 679 A1 1/1991

(Continued)

OTHER PUBLICATIONS

Di Cioccio et al., "III-V layer transfer onto silicon and applications," *Phys. Stat. Sol.* (a) 202, No. 4., 2005, pp. 509-515/DOI 10.1002/pssa. 200460411.

(Continued)

*Primary Examiner*—Walter Lindsay, Jr.
*Assistant Examiner*—Abdulfattah Mustapha
(74) *Attorney, Agent, or Firm*—Brinks Hofer Gilson & Lione

(57) ABSTRACT

A method of fabricating thin films of semiconductor materials by implanting ions in a substrate composed of at least two different elements at least one of which can form a gaseous phase on bonding with itself and/or with impurities includes the following steps:

(1) bombarding one face of the substrate with ions of a non-gaseous heavy species in order to implant those ions in a concentration sufficient to create in the substrate a layer of microcavities containing a gaseous phase formed by the element of the substrate;

(2) bringing this face of the substrate into intimate contact with a stiffener; and (3) obtaining cleavage at the level of the microcavity layer by the application of heat treatment and/or a splitting stress.

20 Claims, No Drawings

U.S. PATENT DOCUMENTS

| | | | |
|---|---|---|---|
| 2002/0153563 A1 | 10/2002 | Ogura | |
| 2002/0176975 A1* | 11/2002 | Wright et al. | 428/213 |
| 2002/0185684 A1 | 12/2002 | Campbell et al. | |
| 2003/0077885 A1 | 4/2003 | Aspar et al. | |
| 2003/0087504 A1* | 5/2003 | Erokhin et al. | 438/407 |
| 2003/0134489 A1 | 7/2003 | Schwarzenbach et al. | |
| 2003/0162367 A1 | 8/2003 | Roche | |
| 2003/0199105 A1 | 10/2003 | Kub et al. | |
| 2004/0144487 A1 | 7/2004 | Martinez et al. | |
| 2004/0224459 A1* | 11/2004 | Nishikawa | 438/202 |
| 2004/0224482 A1 | 11/2004 | Kub et al. | |

FOREIGN PATENT DOCUMENTS

| | | |
|---|---|---|
| EP | 0 293 049 B1 | 9/1993 |
| EP | 0 793 263 A2 | 9/1997 |
| EP | 0 801 419 A1 | 10/1997 |
| EP | 0 807 970 A1 | 11/1997 |
| EP | 0 917 193 A1 | 5/1999 |
| EP | 0 938 129 A1 | 8/1999 |
| EP | 0 533 551 B1 | 3/2000 |
| EP | 0 902 843 B1 | 3/2000 |
| EP | 0 994 503 A1 | 4/2000 |
| EP | 1 050 901 A2 | 11/2000 |
| EP | 0 717 437 B1 | 4/2002 |
| EP | 0 786 801 A1 | 6/2003 |
| EP | 0 767 486 B1 | 1/2004 |
| EP | 0 925 888 B1 | 11/2004 |
| EP | 1 014 452 B1 | 5/2006 |
| FR | 2 681 472 A1 | 3/1993 |
| FR | 2 748 850 A1 | 11/1997 |
| FR | 2 748 851 | 11/1997 |
| FR | 2 758 907 A1 | 7/1998 |
| FR | 2 767 416 A1 | 2/1999 |
| FR | 2 773 261 | 7/1999 |
| FR | 2 774 510 A1 | 8/1999 |
| FR | 2 781 925 A1 | 2/2000 |
| FR | 2 796 491 | 1/2001 |
| FR | 2 797 347 | 2/2001 |
| FR | 2 809 867 | 12/2001 |
| FR | 2 847 075 A1 | 5/2004 |
| JP | 62265717 | 11/1987 |
| JP | 101004013 | 1/1989 |
| JP | 07-254690 | 10/1995 |
| JP | 7-302889 | 11/1995 |
| JP | 09-213594 | 8/1997 |
| JP | 09-307719 | 11/1997 |
| JP | 11045862 | 2/1999 |
| JP | 11-87668 | 3/1999 |
| JP | 11074208 | 3/1999 |
| JP | 11-145436 | 5/1999 |
| JP | 11-233449 | 8/1999 |
| WO | WO 99/08316 | 2/1999 |
| WO | WO 99/35674 A1 | 7/1999 |
| WO | WO 99/39378 | 8/1999 |
| WO | WO 00/48238 | 8/2000 |
| WO | WO 00/63965 | 10/2000 |
| WO | WO 01/11930 A2 | 2/2001 |
| WO | WO 02/47156 A1 | 6/2002 |
| WO | WO 02/083387 A1 | 10/2002 |
| WO | WO 03/013815 | 2/2003 |
| WO | WO 2004/044976 | 5/2004 |

OTHER PUBLICATIONS

Kucheyev et al., "Ion implantation into GaN," *Materials Science and Engineering*, 33, 2001, pp. 51-107.

Liu et al., "Ion implantation in GaN at liquid-nitrogen temperature: Structural characteristics and amorphization," *Physical Review B of The American Physical Society*, vol. 57, No. 4, 1988, pp. 2530-2535.

Agarwal et al "Efficient production of Silicon-on-insulator films by co-implatation of HE$^+$ with H$^+$", *Applied Physics Letter, American Institute of Physics*, vol. 72, No. 9, Mar. 1998, pp. 1086-1088.

Bruel et al., [vol. 99-1] Meeting Abstract No. 333, "Single-crystal semiconductor layer delamination and transfer through hydrogen implantation," *The 195th Metting of The Electrochemical Society*, May 2-6, 1999, Seattle, Washington.

Camperi-Ginestet et al., "Alignable Epitaxial Liftoff of GaAs Materials with Selective Deposition Using Polyimide Diaphragms", *IEEE Transactions Photonics Technology Letters*, vol. 3, No. 12, Dec. 1991, pp. 1123-1126.

Cerofolini et al. "Ultradense Gas Bubbles in Hydrogen-or-Helium-Implanted (or Co-implanted) Silicon", *Materials Science and Engineering*, B71, 2000, pp. 196-202.

Demeester, et al., "Epitaxial Lift-off and its Applications", *Semicond. Sci. Technol.*, vol. 8, 1993, pp. 1124-1135.

Feijoo et al., "Prestressing of Bonded Wafers", vol. 92-7 1992 pp. 230-238.

Feng et al., "Generalized Formula for Curvature Radius and Layer Stresses Caused by Thermal Strain in Semiconductor Multilayer Structures", *J. Appl. Phys.*, vol. 54, No. 1, 1983, pp. 83-85.

Hamaguchi, et al., "Novel LSI/SOI Wafer Fabrication Using Device Layer Transfer Technique" *Proc. IEDM*, 1985, pp. 688-691.

Henttinen et al. "Mechanically induced Si Layer Transfer in Hydrogen-Implanted Si-Wafers", *American Institute of Physics*, vol. 76, No. 17, Apr. 2000, pp. 2370-2372.

Moriceau et al., [vol. 99-1] Meeting Abstract No. 405, "A New Characterization Process Used to Qualify SOI Films," *The 195th Meeting of The Electrochemical Society*, May 2-6, 1999, Seattle, Washington.

Pollentier et al., "Fabrication of High-Radiance LEDs by Epitaxial Lift-off" *SPIE*, vol. 1361, 1990, pp. 1056-1062.

Suzuki et al., "High-Speed and Low Power n$^+$-p$^+$ Double-Gate SOI CMOS", *IEICE Trans. Electron.*, vol. E78-C, No. 4, Apr. 1995, pp. 360-367.

Timoshenko, S., "Analysis of Bi-Metal Thermostats", *J.Opt.Soc. Am.*, 11, 1925. pp. 233-256.

Tong et al, "Low Temperature SI Layer Splitting", *Proceedings 1997 IEEE International SOI Conference*, Oct. 1997, pp. 126-127.

Wong et al., "Integration of GaN Thin Films with Dissimilar Substrate Materials by Pd-In Metal Bonding and Laser Lift-off", *Journal of Electronic Materials*, vol. 28, No. 12, 1999, pp. 1409-1413.

Yun et al., "Fractional Implantation Area Effects on Patterned Ion-Cut Silicon Layer Transfer," Dept. of Electrical Eng. And Computer Sciences, University of California, Berkeley, CA 94720, USA, 1999 IEEE International SOI Conference, Oct. 1999, p. 129-30.

Yun et al., "Thermal and Mechanical Separations of Silicon Layers from Hydrogen Pattern-Implanted Wafers," Journal of Electronic Materials, vol. No. 36, No. 8 2001.

Liu, et al., "Ion implantation in GaN at liquid-nitrogen temperature: Structural characteristics and amorphization", Physical Review B, vol. 57, No. 4, Jan. 15, 1998.

Kucheyev, et al., "Ion implantation into GaN", Reports: A Review Journal, Materials Science and Engineering, 33 (2001).

* cited by examiner

THIN FILM SPLITTING METHOD

PRIORITY CLAIM

This application claims priority to French patent application No. FR 0505091, filed May 20, 2005.

TECHNICAL FIELD

The invention relates, in general, to methods for producing thin films in semiconductor substrates and, more particularly, to ion implantation of a semiconductor substrate and transfer of the thin film to another substrate.

BACKGROUND

U.S. Pat. No. 5,374,564 discloses a method of fabricating thin films of semiconductor materials that includes the following steps:

(1) bombarding one face of a substrate with ions in order to implant those ions in a concentration sufficient to create in the substrate a layer of gas microbubbles forming microcavities defining a weakened layer;

(2) bringing this face of the substrate into intimate contact with a stiffener; and (3) obtaining cleavage at the level of the microcavity layer by the application of heat treatment.

In the process described above, the ions implanted in step 1 are hydrogen ions, but it is indicated that light ions of helium type or of other rare gases may also be used. As for the substrate, in the examples concerned it is formed of silicon, but it is indicated that it may also be a semiconductor from group IV of the periodic table of the elements, such as germanium, silicon carbide or silicon-germanium alloys.

In the above process, cleavage is obtained by means of heat treatment, but it is has been proposed, in variants of the method, to bring about cleavage by that kind of heat treatment and/or by applying a splitting stress (for example, by inserting a blade between the two substrates and/or by applying further traction and/or bending and/or shear forces and/or by further application of ultrasound or microwaves of judiciously chosen power and frequency).

It may be noted that the above method implies the formation of a weakening layer formed of microcavities resulting from gaseous species ions and that in practice it is light ions that are implanted. Implanting light ions has the advantage that implantation to significant depths may be easily effected, but this is counterbalanced by the fact that these ions create few defects in the material so that it is therefore necessary to introduce them in large quantities to induce sufficient weakening (typically greater than $10^{16}$ or even $10^{17}$).

The paper "Ion implantation into GaN" by S. O. Kucheyev, J. S. Williams, S. J. Pearton in Materials Science and Engineering, 33 (2001) 51-107 and the paper "Ion implantation in GaN at liquid-nitrogen temperature: Structural characteristics and amorphization" by C. Liu, B. Mensching, M. Zeitler, K. Volz and B. Rauschenbach in Physical Review B of The American Physical Society, 1998, vol 57, N° 4, pp. 2530-2535, disclose that implanting Au or Ar ions in GaN has various advantages, in particular that it enables a well-defined impurity to be implanted at a well-defined depth in a substrate; in particular, it is therefore possible to effect precise doping or to insulate precise volumes electrically or to cause the localized formation of appropriate inclusions. However, experiments have been carried out to characterize the deterioration induced by this kind of implantation and to determine how to eliminate or at least minimize it.

One effect of implanting gold ions in GaN is the creation of crystalline disorder associated with the formation of microcavities that consist of "bubbles" of $N_2$ that result from the agglomeration of N atoms from the substrate. The passing implanted ions cause cascaded displacements of substrate atoms. These cascaded collisions induce a stoichiometric imbalance in the substrate: the heavier element (Ga in the case of GaN) is in excess at shallow depths while the deeper regions are enriched with the lighter element (N in the case of GaN). This effect increases in proportion to the mass of the ions implanted.

SUMMARY

In accordance with one embodiment of the invention, implant degradation is induced by the implantation of a non-gaseous heavy species in a substrate formed of at least two elements of which at least one is able to form a gaseous phase. The implant degradation leads to cleavage of the substrate to yield into a thin layer and a residual substrate.

It is important to note that, although the technology described in U.S. Pat. No. 5,374,564 cited above has been known for many years, including prior to the experiments described above concerning the implantation of Au ions in substrates such as GaN, the inventor has developed a process in which the degradation induced by this implantation is exploited to the produce a cleavage function.

Although the inventor cannot be bound by any particular theory of the invention, in accordance with an understanding of a process in accordance with the invention, the cavities created by the implantation of a non-gaseous species do not contain implanted ions but molecules formed from one constituent element of the substrate in which the implantation has been effected, which is fundamentally different from the teaching of U.S. Pat. No. 5,374,564 (or of documents that have considered variants of the method) in which the gaseous phase, if any, found in the microcavities is formed of implanted ions.

The uniqueness of the inventive process is supported by the inventor's belief that there is nothing to lead the person skilled in the art to think that the quantity of gas contained in the microcavities induced by the implantation of ions of a non-gaseous species could be sufficient for heat treatment or the application of a mechanical stress to be able to bring about cleavage.

Moreover, the degradation observed in the GaN because of implantation of Au ions was described in the prior art as being distributed and dispersed within the volume (for example from the free surface of the substrates to a depth of a few hundred nanometers), with the result that there was nothing that might lead the person skilled in the art to suppose that such degradation was nevertheless sufficient to weaken the substrate locally and to lead to a cleavage sufficiently well localized, in the case of heat treatment or the application of mechanical stress, to enable the formation of a thin layer usable afterwards.

DETAILED DESCRIPTION

In accordance with an aspect of the invention, implantation of ions of a non-gaseous heavy species in a substrate formed of at least two elements one of which is able to form a gaseous phase can also lead to cleavage similar to the cleavage. The cleavage is similar to that described in the technology disclosed in U.S. Pat. No. 5,374,564. The expression "heavy species" means a species having an atomic weight greater than 20, or even 40, or even 100.

In accordance with one embodiment of the invention, a method of fabricating thin films of semiconductor materials by implanting ions in any substrate composed of at least two different elements at least one of which can form a gaseous phase on bonding with itself and/or with impurities (residual or introduced, an the like.). For example, the method may be applied to the following substrates: GaN, GaAs, a-Si:H, diamond, and the like.

The method includes the following steps:

(1) bombarding one face of the substrate with ions of a non-gaseous heavy species in order to implant those ions in a concentration sufficient to create in the substrate a layer of microcavities containing a gaseous phase formed by the element of the substrate;

(2) bringing this face of the substrate into intimate contact with a stiffener; and (3) obtaining cleavage at the level of the microcavity layer by the application of heat treatment and/or a splitting stress (for example, inserting a blade between the two substrates and/or applying further traction and/or bending and/or shear forces and/or further application of ultrasound or microwaves of judiciously chosen power and frequency).

Accordingly, in the above method, and in contradistinction to the method described in U.S. Pat. No. 5,374,564, the ions implanted in step 1 are not gaseous species: the ions implanted are any type of non-gaseous heavy ions (Au, W, Si, Ag, and the like). The effectiveness of the stoichiometric imbalance induced by this implantation is in direct proportion to the mass of the implanted ions: the greater the mass of the implanted ions, the lower the dose necessary to achieve cleavage.

In a variant of the method, there may be obtained after step 1 a region of microcavities that extends from the surface to a depth of a few tens or even hundreds of nanometers below the surface. There may therefore be obtained after implantation a surface film of a "structured" material consisting of a matrix (the initial material) and microcavities (voids, characterized by an absence of material), which can be characterized as a porous material. There may also be obtained a structured material consisting of a matrix and precipitates of implanted ions and/or elements of the initial material. This type of structured material may have advantageous optical and/or electrical and/or mechanical properties compared to the initial material (for example like porous Si compared to Si). It has nevertheless become apparent that, even if this region of microcavities extends from the surface to a certain depth, it is possible to bring about cleavage at a given depth, because there is always a depth such that the density and/or the size of the microcavities is at a maximum or such that the stress between the region of microcavities and the matrix is at a maximum. This depth defines the cleavage zone; the operating conditions for obtaining this cleavage should be evident to the person skilled in the art, given his experience of the technology deriving from U.S. Pat. No. 5,374,564.

Heat treatment may be carried out after implantation to cause the microcavities to evolve by diffusion/recombination and to increase the pressure of the gaseous phase.

To bring about cleavage, the structured material surface film may then be bonded to a stiffener (step 2). The cleavage step 3 is effected in the microcavity layer. The location and the width of the microcavity layer depend on the nature of the implanted ions, the implantation parameters (energy, dose, temperature, and the like), and the cleavage heat treatment, if any; the person skilled in the art knows how to select these parameters without any particular difficulties. Depending on the experimental conditions, the structured film may therefore be transferred in whole or in part to the stiffener.

Thus the general method of the invention may have the following advantageous features, separately or in combination:

1) the substrate is a nitride (which gives rise to the formation of nitrogen within the substrate as a consequence of implantation); an instance of particular practical benefit is gallium nitride, 2) alternatively, the substrate is an arsenide; an instance of particular practical benefit is gallium arsenide, 3) alternatively, the substrate is a hydride (which gives rise to the formation of gaseous hydrogen as a consequence of the implantation); an instance of particular practical benefit is hydrogenated amorphous silicon α-Si H, 4) alternatively, the substrate is essentially formed of carbon and contains a residual amount of impurities such as hydrogen (atomic quantity of the order of 1%); for example, an instance of particular practical benefit is diamond, 5) the implanted ion is a heavy metal ion; the implantation of gold ions is already well known in the art, but in accordance with the invention other ions may also be implanted, such as tungsten, silver, silicon or cesium, 6) alternatively, the implanted ion is a non-metallic heavy ion, such as erbium, selenium or bismuth, 7) the implanted ion is implanted at a dose from $10^{12}$ cm$^{-2}$ to $10^{16}$ cm$^{-2}$ with an energy from 2 MeV to 40 keV, respectively, the dose being adapted in particular as a function of the mass of the implanted ion and of the material to be implanted, 8) cleavage is brought about by simple heat treatment, 9) alternatively, cleavage is brought about by at least one application of a splitting stress (where appropriate in addition to heat treatment); this stress may in particular be applied by inserting a blade between the two substrates and/or by applying further traction and/or bending and/or shear forces or further by means of ultrasound or microwaves of particular power and frequency.

EXAMPLES

Example 1

In a first example, a crystalline GaN ($^{70}$Ga$^{14}$N) substrate is implanted with Au ions under the following conditions: an implant energy of 2 MeV, and a dose of $10^{16}$ cm$^{-2}$. There is obtained in this way spherical microcavities (bubbles of $N_2$) with controlled characteristics (dimensions of tens of nanometers, depth from the surface up to 400 nm below the surface with bubbles with a maximum size of around 250 nm). Porous GaN is formed in this way, which is a material that may have advantageous optical and/or electrical and/or mechanical properties compared to GaN. The porous GaN substrate is then bonded by molecular adhesion to a stiffener (for example sapphire). For this purpose a layer of $SiO_2$ could be provided on the GaN substrate prior to implantation, for example. The sapphire substrate is also provided with a layer of $SiO_2$. This is followed by mechanical-chemical polishing and bringing the substrates into contact with each other.

An appropriate heat treatment or annealing step (at a temperature from 200 to 1100° C.) enables diffusion of the various atoms and/or species obtained after implantation and/or pressurization of the cavities to cause them to grow. This growth of the microcavities induces stresses and causes certain ones of them to coalescence, which leads to cleavage of the substrate at the level of the microcavity layer.

The thickness of the layer obtained from the above process is from 100 to 400 nm.

Example 2

In a second example, a wurtzite type crystalline GaN ($^{70}$Ga$^{14}$N) substrate is implanted with Au ions under the following conditions: an implant energy of 300 keV, and a dose of $6 \times 10^{14}$ cm$^{-2}$. Lenticular microcavities are obtained in this way with controlled characteristics (the microcavity dimensions are a few tens of nanometers, and the depth is up to 50 nm below the surface with a maximum cavity density 20 nm below the surface), the size and the density of the microcavities are a function of the implanted dose. The GaN substrate structured and weakened in this way may then be subjected to a step of bringing it into intimate contact with a silicon stiffener by molecular bonding. The insertion of a blade, either alone in combination with heat treatment, for example carried out beforehand, leads to cleavage of the GaN substrate at the level of the microcavity zone. The above method may be used to produce thin films of "structured" GaN on silicon, for example, the thin film consisting of the portion of the substrate remaining on the stiffener after cleavage.

Example 3

Tungsten is implanted in a Ga.As substrate, after which annealing heat treatment is applied at a temperature exceeding 450° C.

Example 4

Tungsten is implanted in an α-Si—H substrate.

The invention claimed is:

1. A method of fabricating thin films of semiconductor materials by implanting ions in a substrate, the substrate comprising at least two different elements at least one of which can form a gaseous phase on bonding with itself or with impurities or both, the method comprising the following steps:
   (1) bombarding one face of the substrate with ions of a non-gaseous heavy species in order to implant those ions in a concentration sufficient to create in the substrate a layer of microcavities containing a gaseous phase formed by at least one of the at least two different elements of the substrate;
   (2) bringing the face of the substrate into intimate contact with a stiffener; and
   (3) cleaving the substrate at the level of the microcavity layer by the application of heat treatment or a splitting stress, or both.

2. The method according to claim 1, wherein the species of the ions and the implantation conditions are such that the layer of microcavities extends to face of the substrate.

3. The method according to claim 1, wherein the substrate comprises a nitride.

4. The method according to claim 3, wherein the substrate comprises gallium nitride.

5. The method according to claim 1, wherein the substrate comprises an arsenide.

6. The method according to claim 5 wherein the substrate comprises gallium arsenide.

7. The method according to claim 1, wherein the substrate comprises hydrogenated amorphous silicon.

8. The method according to claim 1, wherein the substrate comprises diamond.

9. The method according to claim 1, wherein the ions comprise heavy metal ions.

10. The method according to claim 9, wherein the ions comprise one of Au, W, Ag, Si or Cs.

11. The method according to claim 1, wherein the ions comprise Er, Se or Bi.

12. The method according to claim 1, wherein the ions are implanted at a dose from $10^{12}$ cm$^{-2}$ to $10^{16}$ cm$^{-2}$ with an energy from 2 MeV to 40 keV, respectively.

13. The method according to of claim 1, wherein cleaving the substrate comprises applying a heat treatment in the absence of a splitting stress.

14. The method according to claim 1, cleaving the substrate comprises applying a splitting stress by applying a force.

15. The method according to claim 14, wherein applying a splitting stress comprises one or more of inserting a blade between the two substrates, applying further traction, bending, or applying shear forces.

16. The method according to claim 15, wherein applying a splitting stress comprises applying ultrasound or microwaves of appropriate power and frequency.

17. A method of fabricating thin films of semiconductor materials, the method comprising:
   providing a substrate comprising at least two different elements,
   wherein at least one of the elements can form a gaseous phase on bonding with itself or with impurities or both;
   implanting ions having an atomic weight greater than about 20 into a face surface of the substrate,
   wherein a reaction in the substrate forms a gaseous phase comprising at least one of the at least two different elements of the substrate, the gaseous phase creating microcavities in the substrate and forming a porous layer;
   bringing the face of the substrate into intimate contact with a stiffener; and cleaving the substrate at the level of the microcavity layer by the application of heat treatment or a splitting stress, or both.

18. The method of claim 17, wherein the substrate comprises a nitride and the gaseous phase comprises nitrogen.

19. The method of claim 17, wherein the substrate comprises a hydride and the gaseous phase comprises hydrogen.

20. The method of claim 17, wherein the substrate comprises a gallium arsenide and the gaseous phase comprises arsine.

* * * * *